United States Patent
Kikuchi et al.

(10) Patent No.: US 6,587,260 B2
(45) Date of Patent: Jul. 1, 2003

(54) BAND-EXPANDING METHOD FOR OPTICAL AMPLIFIERS AND OPTICAL TRANSMISSION APPARATUS

(75) Inventors: Nobuhiko Kikuchi, Tokyo (JP); Ryoji Takeyari, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/935,543

(22) Filed: Aug. 24, 2001

(65) Prior Publication Data

US 2002/0145796 A1 Oct. 10, 2002

(30) Foreign Application Priority Data

Apr. 9, 2001 (JP) .................................... 2001-109361

(51) Int. Cl.[7] ............................. H01S 3/30; H04B 10/12
(52) U.S. Cl. ..................................... 359/334; 359/341.4
(58) Field of Search ............................. 359/110, 177, 359/334, 341.3, 341.33, 341.4

(56) References Cited

U.S. PATENT DOCUMENTS

| | | | | |
|---|---|---|---|---|
| 6,023,366 A | * | 2/2000 | Kinoshita | 359/177 |
| 6,115,174 A | | 9/2000 | Grubb | 359/334 |
| 6,292,288 B1 | * | 9/2001 | Akasaka et al. | 359/334 |
| 6,310,716 B1 | * | 10/2001 | Evans et al. | 359/124 |
| 6,313,940 B1 | * | 11/2001 | Bode et al. | 359/177 |
| 6,335,820 B1 | * | 1/2002 | Islam | 359/334 |
| 6,344,922 B1 | * | 2/2002 | Grubb et al. | 359/134 |
| 6,388,806 B1 | * | 5/2002 | Freeman et al. | 359/341.1 |
| 6,424,458 B1 | * | 7/2002 | Cornelius et al. | 359/341.4 |
| 6,452,715 B1 | * | 9/2002 | Friedrich | 359/110 |
| 6,452,716 B1 | * | 9/2002 | Park et al. | 359/334 |
| 6,456,426 B1 | * | 9/2002 | Bolshtyansky et al. | 359/160 |
| 2001/0048343 A1 | * | 12/2001 | Islam | 330/4 |
| 2001/0050802 A1 | * | 12/2001 | Namiki et al. | 359/337.11 |
| 2002/0063948 A1 | * | 5/2002 | Islam et al. | 359/334 |

FOREIGN PATENT DOCUMENTS

WO   WO 99/66607   * 12/1999

OTHER PUBLICATIONS

Petabit "Xtera's $110M Surprise: Re: Drawbacks to "ultra wide"" Light Reading (Web Message board Posting) Jan. 30, 2001 (available at www.lightreading.com/boards/message.asp?msg_idx1795.*
Hansen et al. "Capacity Upgrades of Transmission Systems by Raman Amplification." IEEE Photonics Tech. Lett. 9:2, Feb. 1997, pp. 262–264.*

* cited by examiner

Primary Examiner—Thomas G. Black
Assistant Examiner—Andrew R. Sommer
(74) Attorney, Agent, or Firm—Antonelli, Terry, Stout & Kraus, LLP

(57) ABSTRACT

A method for enabling a pump laser to be added on by means of an optical fiber Raman amplifier and reducing signal degradation to be caused by a gain change to occur after and in the pump laser source add-on process.

The above method is achieved as follows. Add-on ports 114-1 and 114-2 are provided in a wavelenth multiplexer 110 so as to enable new wavelength pump laser sources to be added on. When an add-on pump laser source 112 is turned on, the output intensity of each of the pre-installed Raman pump lasers 111-1 and 111-2 changes, thereby the intensity of each signal laser in each pre-installed band is kept unchanged before and after the add-on. The output intensity of each pump laser source that increases/decreases the output, for example, during the add-on is changed linearly with time, thereby the transient gain changes in the pre-installed bands are prevented.

21 Claims, 13 Drawing Sheets

FIG. 5

| | PUMP WAVELENGTH (nm) | | |
|---|---|---|---|
| | 1427 | 1435 | 1455 |
| S | 0 | 30 | 200 |
| E | 70 | 30 | 165 |
| T1 | 35 | 30 | 182.5 |
| T2 | 70 | 30 | 200 |

(mW)

| | PUMP WAVELENGTH (nm) | | | | | |
|---|---|---|---|---|---|---|
| | 1427 | 1435 | 1455 | 1462 | 1470 | 1490 |
| S | 70 | 30 | 165 | 0 | 0 | 0 |
| E | 70 | 60 | 105 | 26 | 15 | 110 |
| T1 | 70 | 45 | 135 | 13 | 7.5 | 55 |
| T2 | 70 | 30 | 165 | 26 | 15 | 110 |

(mW)

BAND-EXPANDING METHOD FOR OPTICAL AMPLIFIERS AND OPTICAL TRANSMISSION APPARATUS

BACKGROUND OF THE INVENTION

The present invention relates to a band-expanding method for optical amplifiers and to an optical amplifier. More particularly, the present invention relates to a band-expanding method for optical amplifiers, which expands the transmission optical signal band by adding on a pump laser source for an optically pumped amplification medium, such as an optical fiber, as well as to an optical amplifier used for the method. In particular, the method and the optical amplifier are used for optical fiber Raman amplifiers, optical repeaters, etc. employed for optical information communications.

The wavelength-division multiplexing (WDM) optical transmission method, that is used to transmit information by multiplexing a plurality of optical signals having different wavelengths from each other in an optical fiber, is very effective for increasing the capacity of optical fiber communication. To repeat/amplify an optical signal in such a way, however, it is required to use rare-earth doped optical fiber amplifiers, such as the EDFA (Erbrium-doped Fiber Amplifier), semiconductor optical amplifiers, and optical fiber Raman amplifiers, such as the optical fiber amplifier.

The WDM transmission apparatus combines those optical amplifiers so as to repetitively amplify each optical signal that has been attenuated due to the transmission thereof in an optical fiber as long as several tens of kilometers, thereby enabling the signal to be transmitted through a distance of more than several hundreds to several thousands of kilometers. Conventionally, the EDFA has been used as an optical amplifier of the commercial WDM transmission apparatus. As the WDM transmission apparatus is getting upgraded in band width and in capacity, the conventional EDFA amplification bands (about 30 nm, i.e. from 1530 nm to 1560 nm for conventional C-band optical amplifiers) have come to be short of transmission bands. In order to solve this problem, it is now under examination to use L-band EDFAs (about 30 nm, i.e. from 1570 nm to 1600 nm) having different wavelength bands from each other that are disposed in parallel and in which optical amplifiers are used to amplify the signal in each divided band, thereby making the transmission capacity double. Using of optical amplifiers in the 1300 nm band and in the S-band (1490 nm to 1520 nm) is also under examination for some transmission systems.

As described above, the WDM transmission apparatus often employs band-upgrading, that is, a band-expanding method that adds on optical amplifiers band by band so as to reduce the initial installation cost and cope with the transmission capacity requirement that is expected to arise in the future.

FIG. 2 shows a conventional method that uses a plurality of lumped optical amplifiers having different bands from each other as optical repeaters. An optical signal 101, after each wavelength thereof is multiplexed, is transmitted in an optical fiber transmission line 102-1, amplified in an optical repeater 108, and then output to an optical fiber transmission line 102-2. Because the number of signal wavelengths is small at the initial time, the method uses no band add-on optical amplifier 107 (dark portion). The optical signal is thus amplified only in a pre-installed optical amplifier 104. For example, a C-band EDFA or the like is usually used as the pre-installed optical amplifier 104. A wavelength band demultiplexer 105 and a wavelength band multiplexer 106 are disposed before and after the pre-installed optical amplifier 104, respectively, so as to cope with-bands to be added on in the future.

The above method enables both of the band add-on wavelength demultiplexer 105 and the wavelength band multiplexer 106 to be prepared beforehand, so that it is just required to provide a band add-on optical amplifier 107 in order to expand a band. As the band add-on optical amplifier, for example, any of L-band, S-band, and 1300 nm band optical amplifiers can be used. In the practical optical transmission, the configuration of any of pre-installed bands and add-on bands is arbitrary. For example, the C-band can be divided into sub-bands, each of which can be added on independently of others, or the L-band can be used as a pre-installed band.

In recent years, in addition to those optical amplifiers, it is also under examination to use the optical Raman amplifier (hereinafter to be referred to simply as the Raman amplifier) that uses an optical fiber as an amplification medium. The Raman amplification is a phenomenon in which an optical gain is caused to occur due to the Raman Effect from a pump wavelength within a range of about 110 nm at the longer wavelength side. The Raman effect is a kind of non-linear effect which is caused to appear when a strong pump laser beam (several tens of mW to several W) is entered into an optical fiber. The magnitude of the gain is not constant and a peak appears at a point spaced by about 100 nm from-the pump laser wavelength. It has a triangularly shaped gain characteristic in which the gain decreases smoothly up to the pump wavelength from the peak. Generally, the Raman amplification is employed for signal amplification, in which a Raman pump laser source is disposed in an optical repeater, an optical site, or the like so as to input the pump laser in the forward or backward direction in terms of the transmission direction of the signal light into the optical fiber transmission line, with use of the optical fiber transmission line itself as a gain medium. When a wavelength-multiplexed signal is amplified by such a Raman amplifier, a pump laser having a plurality of wavelengths is usually used, and the intensity of each pump laser is set to a proper ratio so as to flatten the gain within a wavelength range of the wavelength-multiplexed signal. It is well known that the method can obtain a flat gain up to about 100 nm.

On the other hand, while there is almost no case in which Raman amplifiers are used commercially, employment of the method is under examination. This is because the signal/noise (S/N) ratio of an optical signal can be improved and the transmission distance can be extended more than the case in which only the conventional lumped optical amplifiers are used when the Raman amplification and the lumped optical amplification are employed together. The U.S. Pat. No. 6,115,174 (document 1) discloses a method that uses the Raman gain to change signal powers and signal gain shapes.

The document 1 relates to setting of the amplification characteristic for each signal within a specific wavelength range. However, the document 1 does not mention the expanding of amplification bands and the adding-on of bands and pump laser sources so as to amplify signals in an add-on (newly-installed) wavelength range and a wavelength range (amplification range) of pre-installed amplifiers.

SUMMARY OF THE INVENTION

Unlike conventional lumped optical amplifiers, the gain band of the Raman amplifier cannot be added on band by band independently, since the optical gain of the pre-installed band and the add-on band is mutually overlapping. This is because the optical gain medium, that is, the optical fiber, is commonly used by all of the bands in the Raman amplifier.

It is well known that an increase in the number of wavelengths of Raman pump laser sources can improve the gain flatness and expand the gain bandwidth. A simple increase of pump laser sources, however, causes a problem in that the gain characteristic cannot be flattened nor shaped as desired after the add-on, since the optical gain bands-induced by the pre-installed pump-laser sources and the add-on pump laser sources are mutually overlapping. Hereinafter, this problem will be described in more detail.

FIGS. 3(a) to 3(c) are graphs which illustrate a synthesized gain of a Raman amplifier. FIG. 3(a) shows how both wavelength and intensity of pump lasers are adjusted so as to flatten the gain at 10 dB in a pre-installed C-band, where, for example, the gain ripple is less than 1 dB. On the contrary, FIG. 3(b) shows an example in which the wavelengths of the pump laser sources is shifted to the long wavelength side and set so as to flatten the gain in the L-band, as well. FIG. 3(c) shows the synthesized gain of FIG. 3(a) and FIG. 3(b), in which pump laser sources in FIG. 3(b) are simply added to the pump laser sources in FIG. 3(a).

FIG. 3(c) shows a simple example in which it is assumed that the gains are added linearly. Even in such a case, each of the gains in FIG. 3(a) and FIG. 3(b) is extended from a band into another band, so that the gains are synthesized and the result is shaped as shown in FIG. 3(c). As a result, the gain of the C-band, in which an optical signal is already transmitted, changes by about 10 dB at a maximum, thereby the optical signal might be degraded significantly. The gain band becomes uneven at the L-band side, so that the gain changes significantly at a wavelength of around 1570 nm and the signal transmission is disabled. It is well known that wavelength-multiplexed Raman pump lasers often interact each other due to the Raman effect in an actual Raman amplifier. Thus, gains are synthesized non-linearly and this makes it more difficult to add on pump lasers.

As described above, when a gain change occurs in a wavelength band in which an optical signal is already transmitted, the optical signal intensity changes significantly. The optical signal intensity increases so as to increase the non-linearity effect of the optical fiber, thereby the signal transmission property is degraded. Some of the wavelength-multiplexed signals are extremely amplified, so that the gains of other signals are reduced and the S/N ratio of each signal is degraded. It is also expected that the signal intensity change causes the allowable input range of a receiver to be exceeded, thereby the receiver is damaged, or the receiver automatic-gain control (AGC) circuit is unable to track an abrupt power change at a pump laser add-on time, resulting in transmission errors. Similar problems might also arise even in a new add-on band, since the signal gain cannot be flattened after the add-on.

For example, the logical threshold level in a receiver is usually set to around 50%. Consequently, when the optical signal gain drops abruptly by 3 dB at an add-on time, the amplitude of the received signal in the receiver drops by 50%, thereby the signal amplitude in the receiver further goes down, resulting in a problem in that the signal reception is disabled completely. This is why the gain change in the first band must be suppressed at the highest within 2 dB.

Under such circumstances, it is an object of the present invention to provide an optical amplifier that has solved the above-described conventional problems. Concretely, it is an object of the present invention to provide a band-expanding method for optical amplifiers, which can prevent optical signals in the pre-installed bands from degradation and the add on of new wavelength bands while the gains of the pre-installed bands are held as they are.

It is another object of the present invention to provide a wide band optical amplifier that can share a single gain medium with a plurality of wavelength bands used for the method, and an apparatus to be used for the optical amplifier.

In order to achieve the above objects, the band-expanding method of the present invention for optical amplifiers expands an amplification band for optical amplifiers so as to amplify an optical signal in a second transmission band at a predetermined gain characteristic with use of an optical amplifier having a first pump laser source used to amplify an optical signal in a first transmission band, which is different from the second transmission band.

The band-expanding method of the present invention comprises: a first step of adding on a second pump laser source separately from the first pump laser source, and a second step of controlling both of the first and second pump laser sources after the processing in the first step so that the first and second transmission bands have a predetermined gain characteristic, respectively.

The first pump laser source need not necessarily be a single pump laser, rather, it may be a plurality of laser sources. Similarly, the second pump laser source also may be a plurality of laser sources. The second pump laser source is added on in two ways; in one way, a second pump laser source is connected physically, and in the other way, a pump laser source that is not turned on is prepared beforehand, then it is turned on (activated).

In a preferred embodiment of the present invention, the practical property of each optical amplifier can be improved especially when the distributed Raman amplifier is used together with a lumped optical amplifier, such as a rare-earth doped optical fiber amplifier and a semiconductor amplifier. In another preferred embodiment of the present invention, the output intensity values of some or all of the pre-installed (the first pump laser sources) and the add-on pump laser sources (the second pump laser sources) are changed simultaneously when pump laser sources to be added on are turned on in the second step so as to prevent transmission signals from degradation in the add-on transition state of the second pump laser sources. Specifically, the degradation of the optical signal in the pre-installed band caused by the change of the signal gain and the signal power during the band add-on process can be suppressed as follows. The pump powers are carefully controlled at each instance from the start state through the transition state to the end state, so that the total optical gain characteristic of the pre-installed band and the add-on band matches the specified gain profile; for example, the gain of the pre-installed band is unchanged through all the states from the start to the end.

The method for setting the pump laser intensity in a transition state can be realized easily, for example, when the ratio between output intensities before and after the add-on or the ratio of each wavelength to the pump laser output intensity is changed approximately linearly with respect to time so as to shift the state before the add-on to the state after the add-on. This is also effective even when pump lasers interact with each other to some degree.

Furthermore, in order to achieve the above objects, the optical amplifier of the present invention includes a Raman amplifier having a first pump laser source used to amplify an optical signal in a first transmission band (an amplification band before the add-on) and means for adding on a second pump laser source which is used to amplify an optical signal in a second transmission band (amplification band after the add-on) with use of the above Raman amplifier. The second transmission band is different from the first transmission band. The optical amplifier is configured controllably so as to obtain the gains of the first and second transmission bands described above as predetermined gain characteristics.

The means for adding on the above-mentioned second pump laser includes a state in which the second pump laser source is connected to a distributed Raman amplifier and is inactive electrically. The means also includes setting means for controlling either the wavelength or the intensity of the above first and second pump laser sources.

The present invention is especially effective in a distributed optical amplifier that is used as a means for amplifying optical signals. The distributed optical amplifier employs the distributed Raman amplification that uses an optical fiber transmission line as an amplification medium. The present invention can prevent optical signals in pre-installed bands from undergoing intensity changes by setting the amplification gain or intensity of each optical signal in pre-installed bands to an approximately fixed value before and after the add-on of a pump laser source. Consequently, it is possible to prevent degradation in the transmission of optical signals caused by the optical fiber non-linearity effect and SIN degradation, as well as preventing deviation of the input ranges, damage, etc to the receivers. For example, it is possible to prevent the items from significant degradation by suppressing gain/light intensity changes under 2 dB.

The output intensity values, as well as the ratio of output intensity values of those pre-installed and add-on pump laser sources before, after the add-on, or in an add-on transition state may be stored as electronic information or reference voltages in the apparatus or obtained from the outside with use of a monitor signal, header information, etc. They may also be written as electronic information when each of the above pump laser sources is added on or the apparatus may be configured so as to receive those information items from the reference voltage source or the memory in the add-on module.

Furthermore, the apparatus may be configured so as to have a variable gain equalizer for controlling the gain or the gain shape of each of the wavelength bands in which pre-installed optical signals are transmitted in order to hold the gain or intensity of each pre-installed optical signal fixedly before, after the add-on or in an add-on transition state.

Other and further objects, features and advantages of the invention will appear more fully from the following description.

BRIEF DESCRIPTION OF THE DRAWINGS

A preferred form of the present invention is illustrated in the accompanying drawings in which:

FIG. 5 is a table which shows the output intensity of the Raman pump laser source before and after the add-on of the Red-band shown in FIG. 4;

DESCRIPTION OF THE PREFERRED EMBODIMENTS

Figure 1:
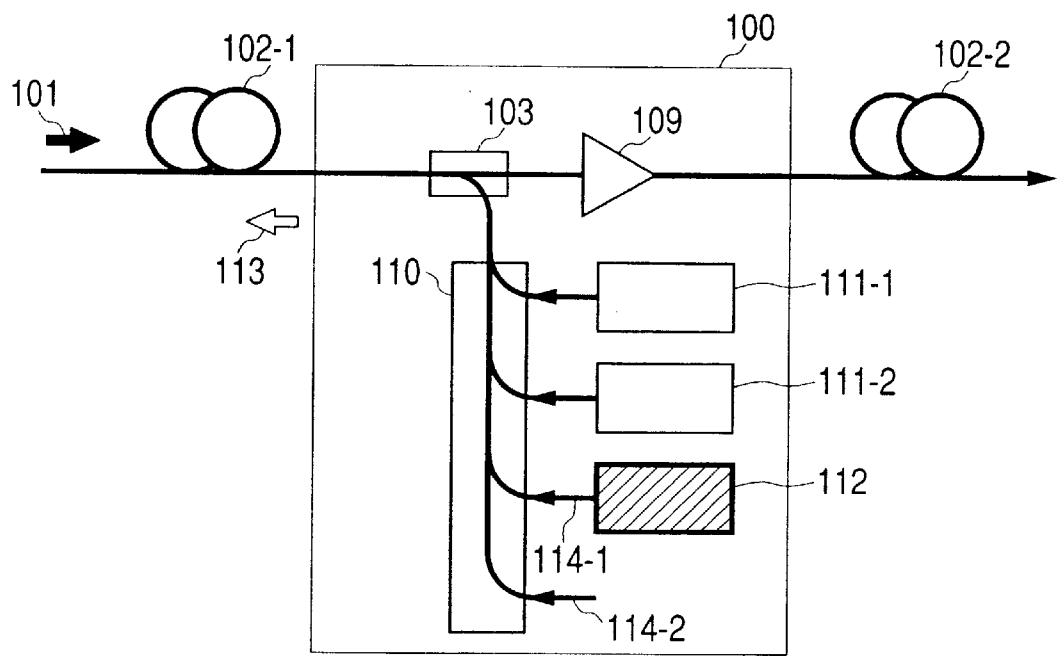
FIG. 1 is a schematic diagram of an optical amplifier representing a first embodiment of the present invention.
Figure 2:
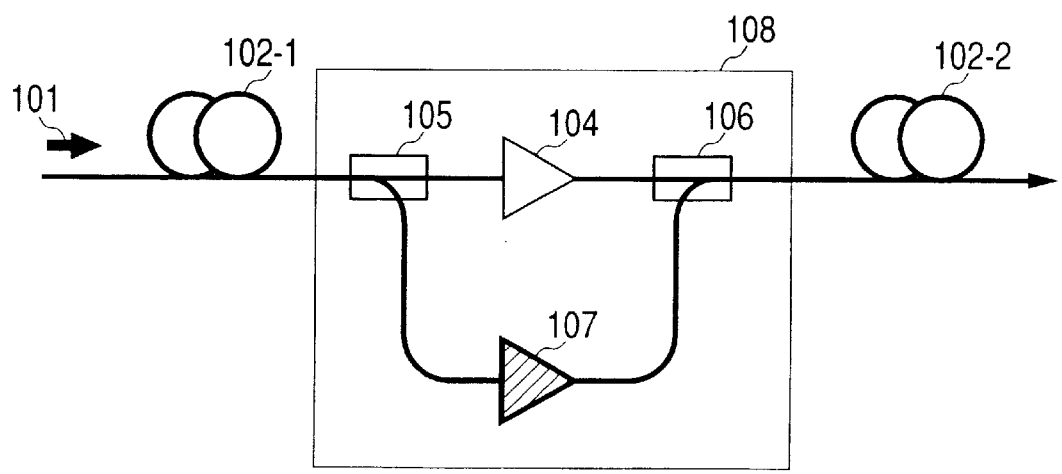
FIG. 2 is a schematic diagram of a conventional optical amplifier.
Figure 3A:
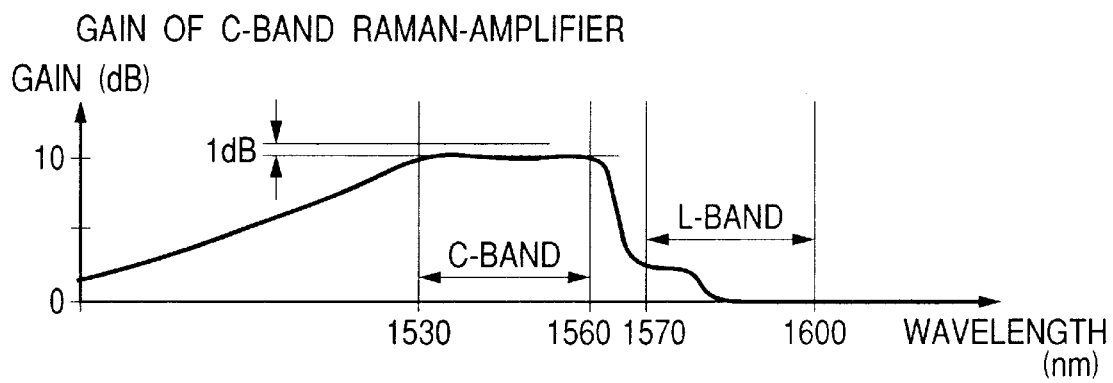
FIGS. 3(a) to 3(c) are graphs showing a characteristic of the synthesized gain of a Raman-amplifier.
Figure 3B:
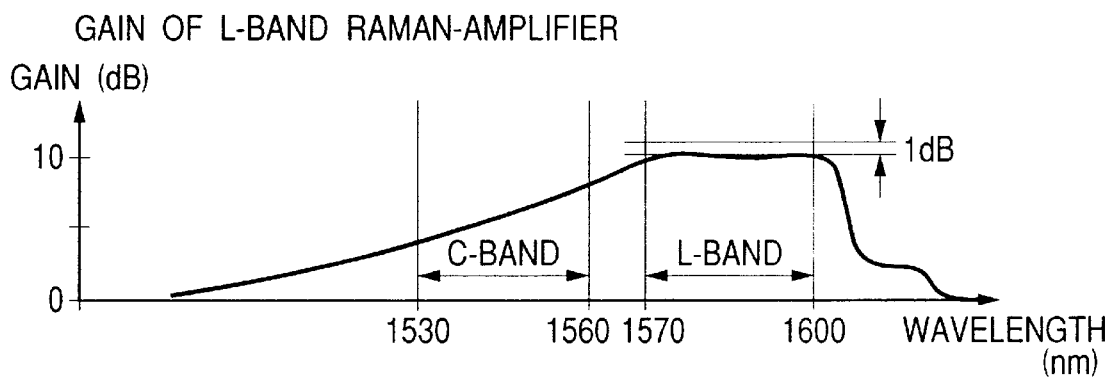
Figure 3C:
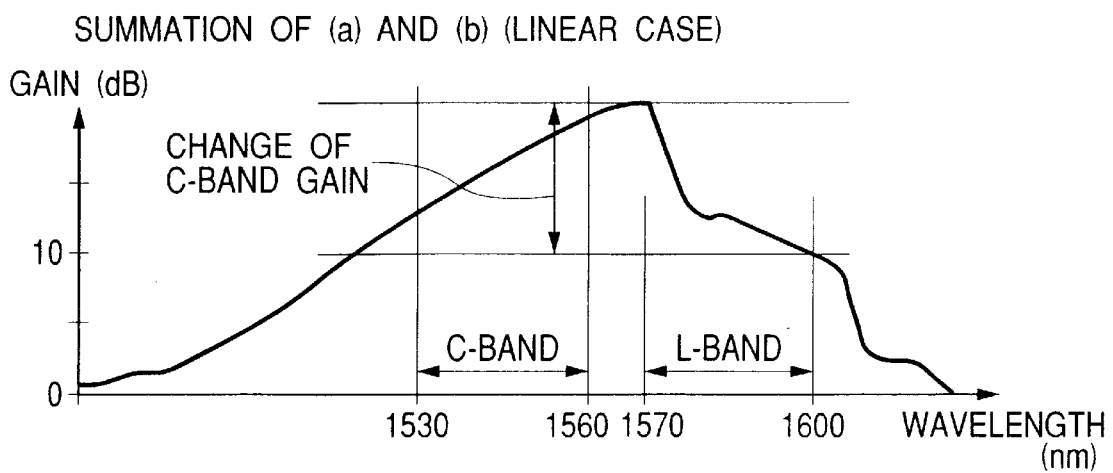

FIG. 1 is a schematic diagram of an optical amplifier representing a first embodiment of the present invention. This first embodiment is an optical repeater 100 provided with a distributed Raman amplifier. In this embodiment, wavelength multiplexed optical signals 101 are transmitted in an optical fiber transmission line 102-1, amplified in an optical repeater 100, and output to an optical fiber transmission line 102-2. This optical amplification employs two amplification methods: distributed Raman amplification performed in the optical transmission line 102 by a backward Raman pump laser beam 113 supplied from a Raman pump multiplexer 103; and amplification by a lumped optical amplifier 109, such as an EDFA. As the Raman pump laser source, pre-installed Raman pump laser sources 111-1 and 111-2 having different wavelengths from each other are disposed before the band-expanding. The wavelength of the lasers output from the sources 111-1 and 111-2 are multiplexed in a wavelength multiplexer 110, then the multiplexed laser beam is output to an optical fiber transmission line 102-1 by a Raman pump multiplexer 103.

The wavelength multiplexer 110 is connected to a turned-off (inactive) pump laser source 112 via a connection port 114-1. The laser source 112 is prepared for band-expanding. The wavelength multiplexer 110 is also provided with a port 114-2 used to connect another pump laser source.

The output intensity values of the Raman pump laser sources 111-1 and 111-2 are adjusted to the characteristic of the optical fiber transmission line 102-1, which is a gain medium, thereby they are controlled so that the gain characteristic of each signal light in pre-installed bands, that is, before band add-on and after band add-on becomes flat. The gain shape, that is, the shape of the characteristic chart denoting the relationship between wavelength and gain is set so as to be inclined intentionally according to the characteristic of the repeater 100 or controlled automatically in some cases. Although the number installed pump of pre-laser sources is not limited, the number of pump laser sources is set so as to reduce the cost and to make it possible to flatten only some of wavelength bands (pre-installed wavelength bands). The number of pump laser sources to be added on is not limited; it is possible to add on a plurality of laser sources having different wavelengths from each another at the same time.

When an amplification band is added on, the pump laser source 112 is turned on or a pump laser source which is added to the port 114-2 is turned on. As a result, a gain arises from the new band, but a gain change also occurs even in each pre-installed wave band. In this embodiment, when the output intensity of each of the pre-installed pump laser sources 111-1 and 111-2 is changed, both gain and intensity of each signal light in the pre-installed band are maintained fixedly even after the pump laser source 112 is turned on. When the pump laser source 112 is added on, a new wavelength optical signal can also be added on. However, because the new wavelength optical signal is not used yet for transmitting optical information, no problem arises as to whether the addition is done before or after the pump laser source is turned on.

Turning on an pump laser source and adjusting the laser intensity may be done manually or automatically. Polarization multiplexing is performed for the Raman pump laser source as needed sometimes. The Raman pump multiplexer 103 shown in FIG. 1 is only required to multiplex pump laser sources; it need not necessarily be a wavelength multiplexer. The wavelength multiplexer may be, for example, an optical coupler, an optical circulator, or the like that has no wavelength dependency, although the loss may increase. In this embodiment, while a backward pumping method is used that pumps each signal light from the downstream side, it may be replaced with a forward pumping method that pumps each signal light from the upstream side, or both pumping methods may be employed together.

Generally, a semiconductor laser is widely used as a pump laser, but another laser, such as a solid laser, an optical fiber ring laser, may also be used.

There are some methods for mounting a pump laser source; for example, a single semiconductor laser is inserted in a socket and a pump laser source unit united with a controller is mounted. The pump laser source add-on port 114 may be an optical fiber connector, means for splicing an optical fiber strand, or means for coupling an optical signal collimated in the air with another with use of a lens system.

Figure 4:
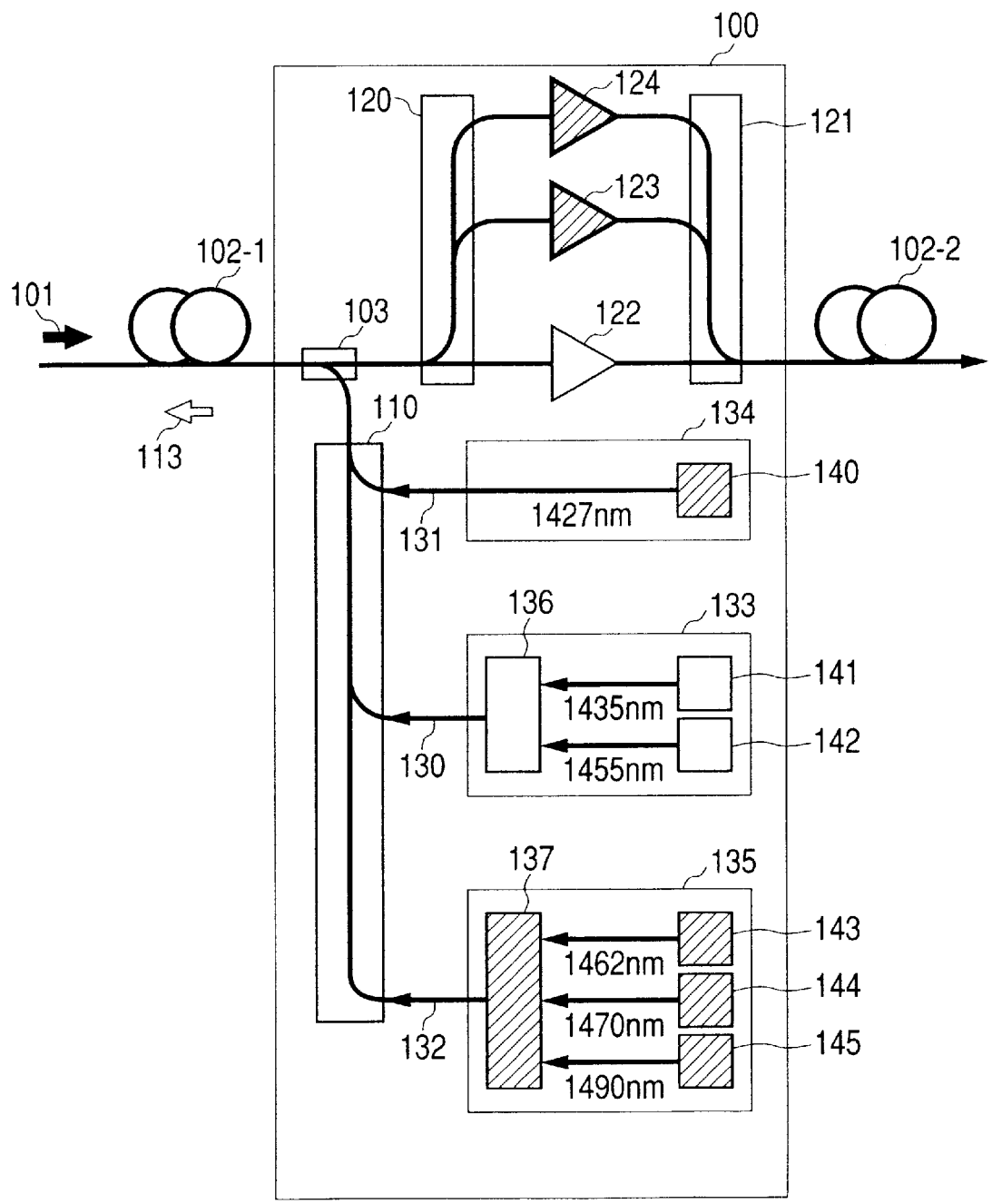
FIG. 4 is a schematic diagram of an optical amplifier representing a second embodiment of the present invention.

FIG. 4 is a schematic diagram of an optical amplifier representing a second embodiment of the present invention. In FIG. 4, the same reference numerals will be used to identify the same components as those shown in FIG. 1, while avoiding redundant description. In this embodiment, an EDFA that is a lumped optical amplifier and a distributed Raman amplifier are used as gain media and the configuration of the second embodiment can add on an EDFA device and a Raman amplification pump laser source. In this configuration, the C-band is divided into two EDFAS: an EDFA with a short-wavelength side Blue-band (1530 to 1542 nm) and an EDFA with a long wavelength side Red-band (1548 to 1560 nm). The configuration further makes it possible to add on an L-band EDFA therein.

In the initial state in which no add-on pump laser source is connected, only a Red-band EDFA 122 is disposed as a lumped optical amplifier and only a Red-band pump laser source unit 133 is disposed as a Raman pump laser source. The unit 133 incorporates a 1435 nm pump laser source 141 and a 1455 nm pump laser source 142 therein. The output laser beams from the two pump laser sources 141 and 142 are multiplexed by a Raman pump multiplexer 136 in the unit 133. The multiplexed laser light is then input to a wavelength multiplexer 110 via a pump laser port 130.

In the initial state, the optical repeater 100 amplifies the optical signal in the 12 nm band of the Red-band. The output intensity values of both Raman pump laser sources 141 and 142 are set to the values shown in the field S (before add-on) in FIG. 5. More specifically, the output intensity of the 1435 nm pump laser source 141 is 30 mW and the output intensity of the 1455 nm pump laser source 142 is 200 mW. The output intensity of the 1427 nm pump laser source 140 is zero, since it is not connected yet or it is not turned on (inactive). The combination of the output intensity values shown in FIG. 5 is just an example; it is varied significantly according to the type of the subject optical fiber, the subject wavelength and the number of pump lasers, and the subject wavelength band.

When the Blue-band is added on, a Blue-band EDFA 123 and a Blue-band add-on Raman pump laser source unit 134 are added on. The unit 134 incorporates a 1427 nm pump laser source 140 therein and the output laser light from the laser source 140 is input to a wavelength multiplexer 110 via the pump laser source add-on port 131. Depending on the configuration of the EDFA, the C-band can be amplified just by one EDFA. In this case, there is no need to divide/add on any EDFAs while it is needed in the EDFA 123/124.

Figure 6:
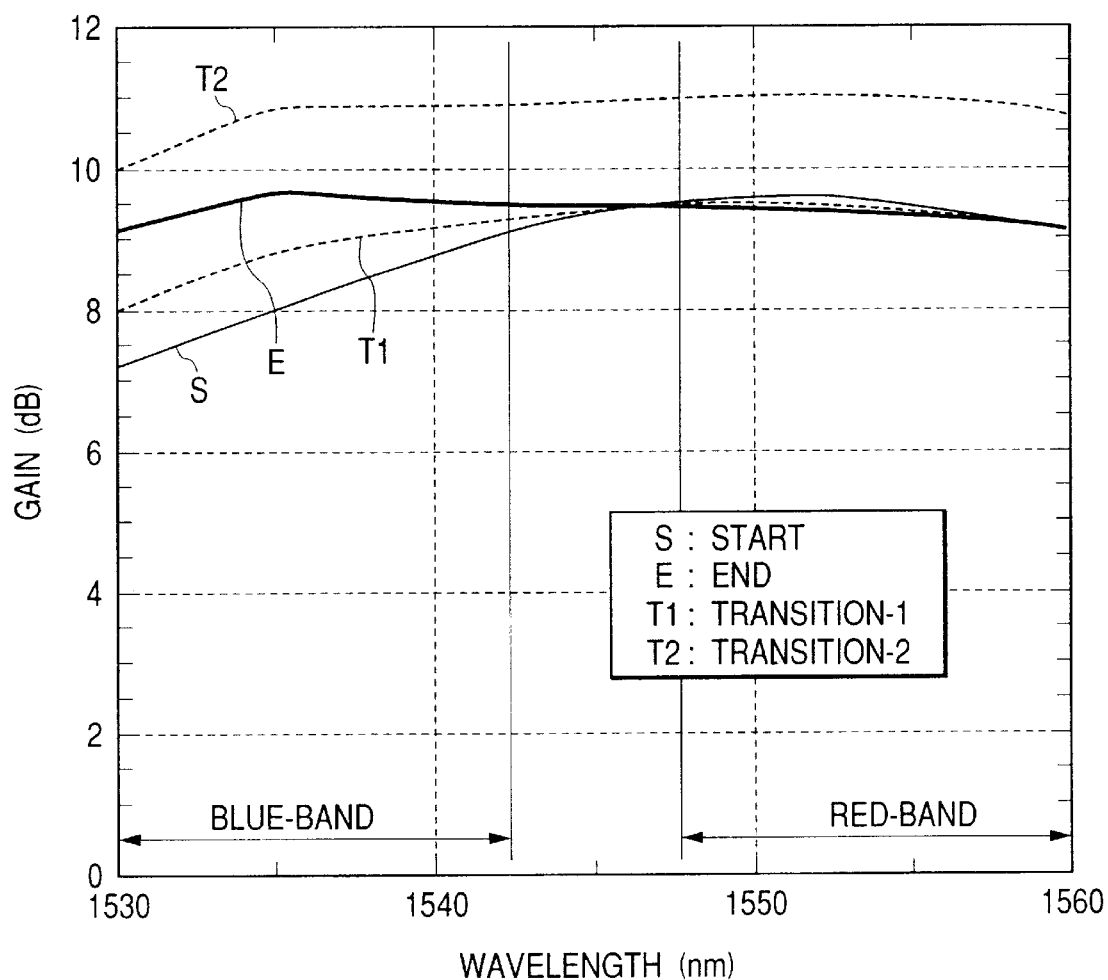
FIG. 6 is a graph which shows the Raman gain before and after the add-on of the Red-band shown in FIG. 4.

FIG. 6 shows the gain characteristic of the embodiment shown in FIG. 5. In FIG. 6, "S" denotes a Raman gain characteristic before the pump laser source unit 134 is added on. In this case, refer to the S line shown in FIG. 5, as well. The pump laser intensity is set here so as to flatten the Red-band gain (9 dB). Because the number of pump laser sources/wavelengths is not enough in this case, the Blue-band gain is not flattened; that is, it is about 2 dB lower than the Red-band around 1530 nm.

The curve E denotes a gain characteristic that is assumed after the Blue-band add-on pump laser source unit 134 is added on. The output of the added-on 1427 nm pump laser source 140 is set to 70 mW and the output of the 1455 nm pump laser source 142 is reduced to 165 mW here. Refer to the E line shown in FIG. 5 as well in this case. Just like the pre-installed Red-band, the same 9 dB gain is also obtained in the Blue-band by controlling the outputs of the pump laser-sources and the Red-band gain is almost unchanged both before and after the add-on of the 1427 nm pump laser source 140.

On the contrary, the curve T2 denotes a gain characteristic assumed when the output laser intensity of the pre-installed pump laser source 133 is unchanged and the new 1427 nm pump laser source 140 is turned on. Also, refer to the T2 line shown in FIG. 5 as well in this case. The Red-band gain is increased by 2 dB at a maximum. When such a signal power change occurs, for example, when the gain is controlled fixedly at the EDFA part, the output power increases. As a result, signal degradation occurs due to the self-phase modulation and the cross-phase modulation effect, those are optical fiber non-linearity effects. When the output power of the EDFA part is controlled fixedly, the EDFA input signal power increases, thereby the EDFA gain dependency on the wavelength changes. Consequently, a gain slope/gain tilt might appear. While the Raman gain in this example is kept flat, a gain slope/gain tilt appears in the Raman gain sometimes after the add-on process. Such a gain slope/gain tilt often causes SN degradation for optical signals having less gain wavelength, respectively, and transmission degradation for optical signals having a large gain wavelength, respectively, due to the non-linearity phenomenon of large gain wavelengths. Because the Red-band is already used for transmitting customer information signals, the signal degradation will cut off information transmission services for those customers and become a serious problem.

In this embodiment, the gain change in each of the pre-installed wavelength bands can be suppressed as described above. The above problems are thus prevented. In particular, in the case of Raman amplification, the gain time constant is as fast as a picosecond order, and the gain change in a transition state in an add-on process becomes very important. Specifically, when the pump laser source intensity changes, the Raman gain follows the change immediately. Therefore, pre-installed optical signals of the pump laser intensity might be degraded unless it is assured that the gain in each of the pre-installed bands is flattened during the whole transition state.

Figures 7, 8:
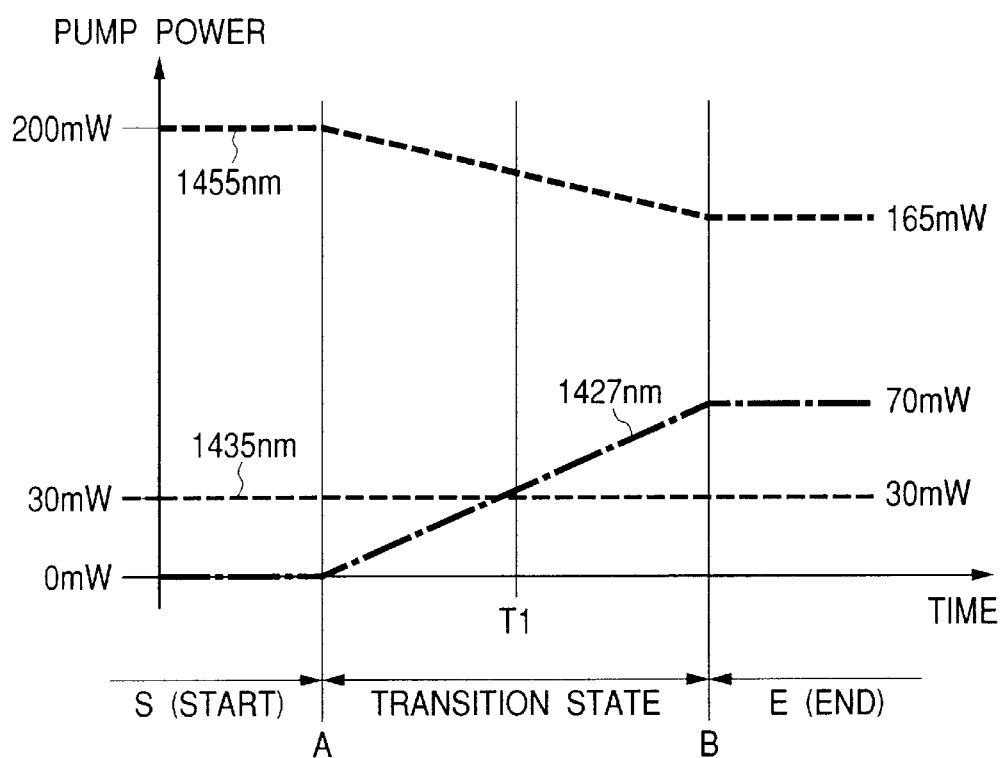
FIG. 7 is a graph which shows a method for controlling the intensity of a pump laser when the Red band is added on as shown in FIG. 4.
FIG. 8 is a table which shows the output intensity of a Raman pump laser-source before and after the add-on of the L-band shown in FIG. 4.

FIG. 7 shows a relationship between time and pump laser intensity so as to describe a controlling method for pump laser intensity by giving consideration to the state of transition to the add-on of the above pump laser source unit. In this example, controlling changes in all the pump laser intensity values at the time A is started in the transition state from the state S before the add-on of the pump laser source unit to the state E after the add-on so as to change the light intensity linearly with respect to the time, thereby terminating the controlling of the changes of all the pump laser intensity values at the time B (controlling with time). The 1427 nm pump laser intensity 0 mW at the time A is increased to 30 mW at the time B, while the 1455 nm pump laser intensity 200 mW at the time A is reduced to 165 mW at the time B.

Because a Raman pump gain is a sum of the gain of each pump laser, the practical gain in each transition state can be kept flat enough even by the simple controlling. This is especially effective when pump lasers do not interact each other so much. For example, the intensity or the gain shape by the pump laser becomes like that of the characteristic T1 at the time T1 as shown in FIG. 5 and FIG. 6. In FIG. 6, the characteristic T1 denotes a gain just between those of the characteristics S and E in the Blue-band area and is almost unchanged from those of both S and E in the Red-band. In this embodiment, therefore, the gain in each of the pre-installed bands is not changed in any transition state, thereby optical signals are prevented from degradation.

In the case of the band-expanding method that adds on pump laser sources as described above, no problem arises from controlling of a transition state even when it takes much time, for example, several seconds to several minutes. The control system may be configured freely without any problem. When the non-linearity effect of a pump laser is extremely strong, however, linear interpolation as described above might not apply to the object correctly. In such a case, it is just required to control the pump laser intensity at a non-linear curve so as to assure a flat gain in each of the pre-installed bands even in an add-on process. As will be described later in connection with another embodiment, the transition state controlling can be done while observing the gain shape and the signal intensity.

In the configuration of the embodiment shown in FIG. 4, it is possible to further add on the L-band. An L-band EDFA 124 and an L-band Raman pump laser source unit 135 are thus added on in the configuration. The pump laser source unit 135 incorporates a 1462 nm pump laser source 143, a 1470 nm pump laser source 144, and a 1490 nm pump laser source 145 therein. The output laser light from the unit 135 is multiplexed with each other by a wavelength multiplexer 137. The multiplexed laser light is then entered to a wavelength multiplexer 110 via a pump laser source add-on port 132. The wavelength multiplexer 137 may be omitted. The pump laser of each wavelength may be entered to the wavelength multiplexer 110 independently of others via an add-on port specific to the wavelength. The configurations of the wavelength multiplexer 110 and 103 are not limited only to those in this embodiment; the configurations may be varied freely, for example, each pump laser may be led into an optical fiber transmission line via a wavelength multiplexer specific to the pump laser.

Figure 9:
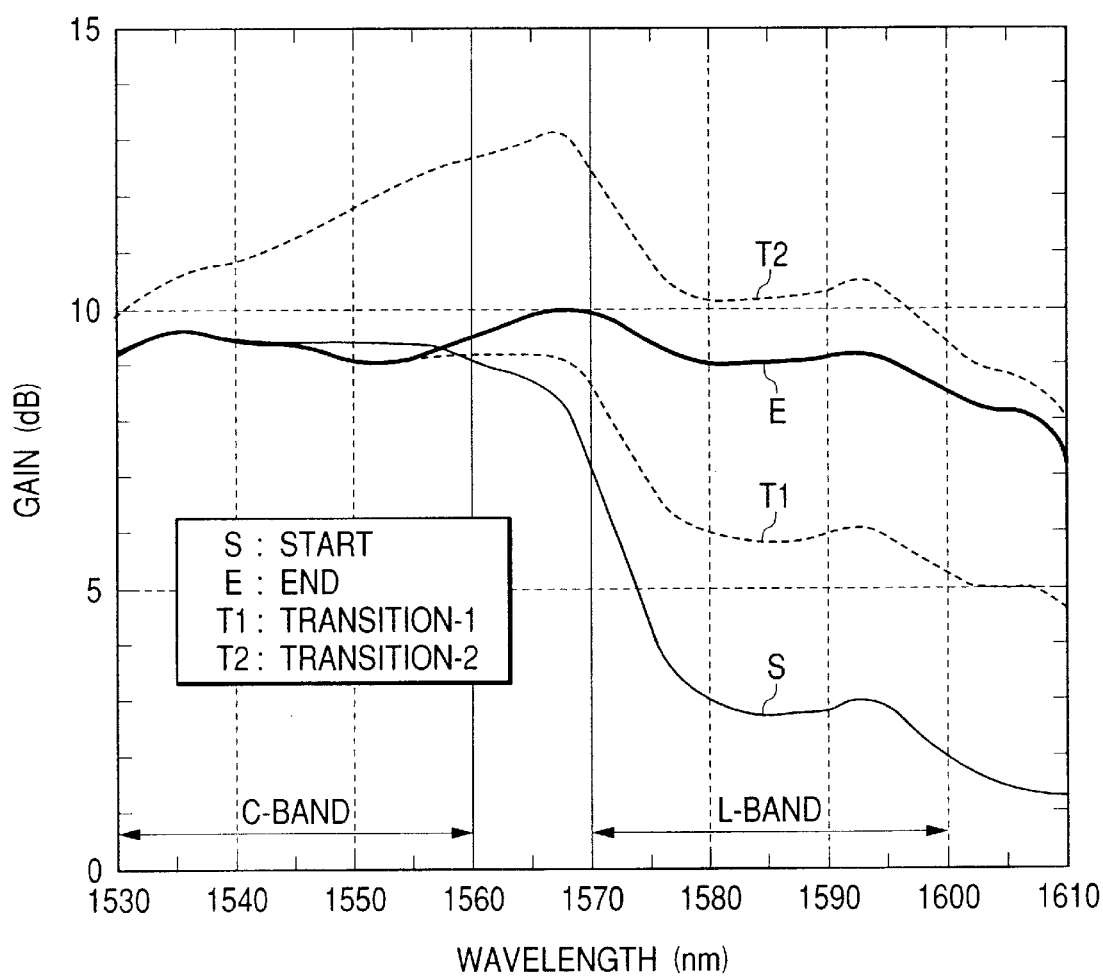
FIG. 9 is a graph which shows a Raman gain before and after the add-on of the L-band shown in FIG. 4.

FIGS. 8 and 9 show the output intensity and the gain characteristic of a Raman pump laser source before and after the L-band is added on. In FIGS. 8 and 9, the characteristic E, after the Blue-band is added on, as shown in FIGS. 5–7, is changed to the characteristic S assumed before the L-band is added on. Before the add-on, the output intensity values of the 1462 nm , 1470 nm , and 1490 nm pump lasers to be added on are all zero, just like that of the characteristic S shown in FIG. 8. As denoted by the gain curve S in FIG. 9, the L-band generates just about 2 dB gain. For the characteristic E after the add-on, the six pump laser output intensity values are adjusted to those in the state E after the add-on in FIG. 8, the gain curve is set just like the characteristic E line shown in FIG. 9. The configuration may also include a pump laser source whose power becomes zero after the add-on. Even in this embodiment, the gain change in the C-band in which a pre-installed optical signal is transmitted is suppressed under 0.5 dB, thereby it is possible to flatten the gain even in the L-band added on together with the C-band.

The characteristic T2 line shown in FIGS. 8 and 9 denotes an example in which a new pump laser source is added-on without the adjustment of pre-installed pump laser output intensity values. In this case, because an L-band pump laser source generates a large gain even in the C-band, for example, the gain to be generated in the 1560 nm pump laser source becomes as large as 3 dB just like that of the characteristic T2 shown in FIG. 9. When the gain of a Raman amplifier is large, the gain change might further become large. In addition, a gain change more than 2 dB occurs even in the L-band, thereby the gain change in the band is shaped so as not to be compensated so easily. Those gains cause transmission degradation as described above, so that the effect of the present invention can be confirmed apparently in the characteristic E after the add-on.

Figure 10:
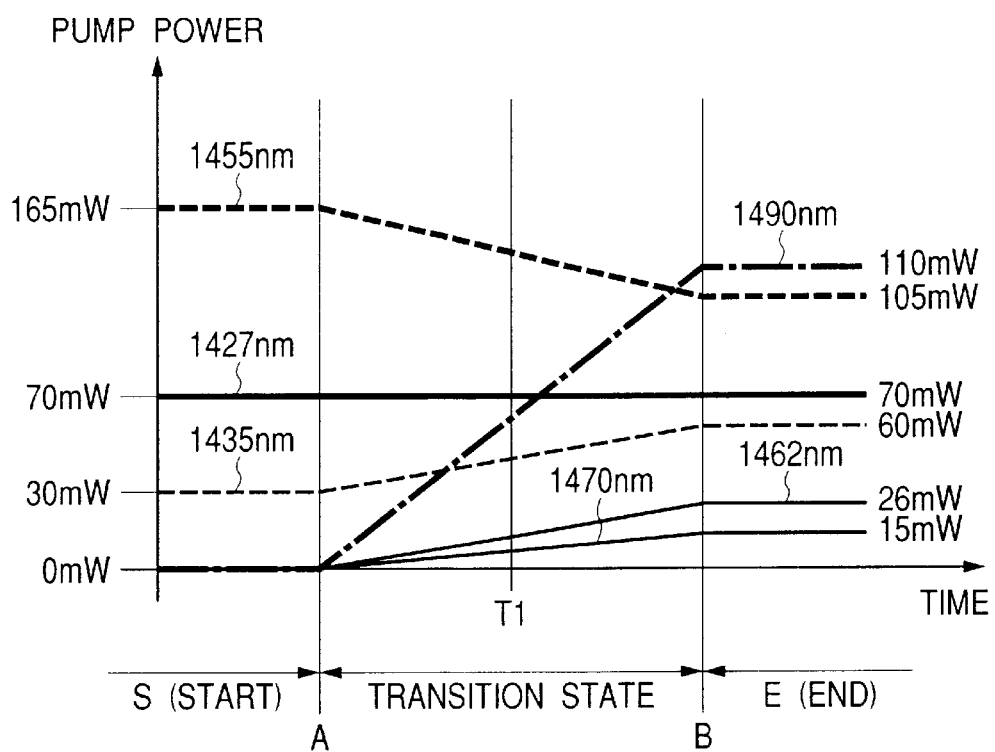
FIG. 10 is graph which shows a method for controlling the intensity of a pump laser when the L-band is added on as shown in FIG. 4.

FIG. 10 shows the transition gain characteristic in another embodiment of the present invention, in which consideration is given to each transition state. Also in this embodiment, controlling is started at the time A for all the pump lasers. Each laser intensity is changed linearly with time and control for all the pump lasers is terminated at the time B. Although the number of pump lasers increases in this embodiment, the control method is unchanged. For example, the intensity or gain shape by pump lasers at the time T1 is shaped just like that of the characteristic T1 line shown in FIGS. 8 and 9. The gain curve T1 shown in FIG. 9 denotes an intermediate gain between those of the characteristics S and E in the new L-band area and it is almost the same as those of the characteristics S and E in the C-band area.

In this embodiment, a Raman gain band is wide, so that pump lasers interact with each other. For example, a change of about 2 dB is observed in the gain of the 1490 nm pump laser according to whether or not another wavelength pump laser exists. The wavelength of the 1490 nm pump laser is the longest. It is thus confirmed that the present invention is also effective even when pump lasers interact to some degree with each other in such a way.

Figure 11:
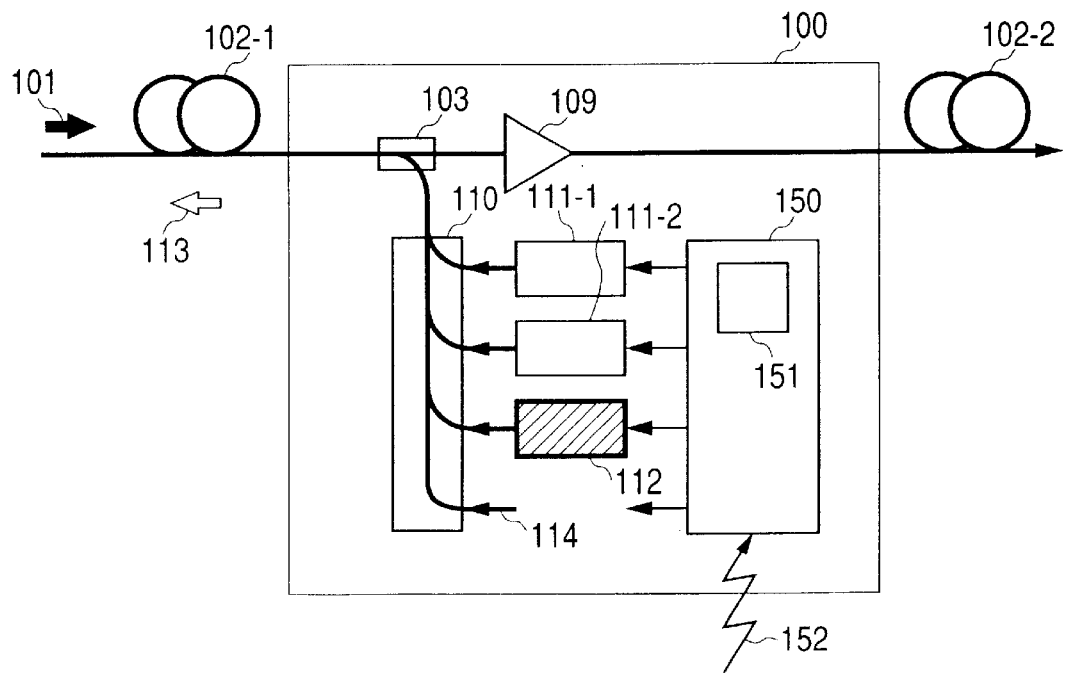
FIG. 11 is a schematic diagram of an optical amplifier representing a third embodiment of the present invention.

FIG. 11 is a schematic diagram of an optical amplifier representing a third embodiment of the present invention. The configuration of this third embodiment includes an optical repeater and a pump laser source controller 150 used to control the laser intensity of each added-on pump laser source. A pump laser intensity table 151 is disposed in the pump laser source controller 150. The table 151 stores the laser intensity values of each pump laser source before and after its add-on. This table 151 stores pump laser intensity values of each pump laser source before and after it is added on in a semiconductor memory and/or a disk drive by a software program and/or set in a hardware device, that is, as a reference voltage, a voltage dividing circuit using registers, etc. When the optical repeater 100 receives a band upgrading start signal 152 from the outside, the pump laser source controller 150 checks to see whether or not the add-on pump laser source 112 exists, then starts setting of a pump laser intensity value. More specifically, the controller 150 refers to the pump laser source table 151 so as to read the laser intensity value of each pump laser source before and after the add-on, then calculates the pump laser intensity at each time in the transition state so as to set each pump laser intensity until the added-on laser intensity is reached in a predetermined time. As shown in FIGS. 7 and 10, when the pump laser intensity changes monotonously at each time in the transition state, the value is merely interpolated linearly. Therefore, it is very easy.

The band upgrading start signal 152 is not necessarily needed. Instead of the signal 152, it is also possible to detect add-on of a pump laser source, optical fiber connection, etc. internally, thereby adding on a band, that is, setting a pump laser intensity automatically. A manual button provided on the subject device, a remote command issued by a monitor signal, or the like may be used as the band upgrading start signal 152.

Values to be stored in the pump laser intensity table 151 may not only be those before/after the add-on, but also curves of pump laser intensity values to be changed with time in transition states and stored in tables, as functions, etc. beforehand. This will be effective specially when the inter-pump-laser Raman interaction is strong, when a complicated interpolation calculation is needed, etc.

The output of a pump laser source before and after the add-on may be transferred from another site, an optical repeater station, etc. as part of monitored information without storing it in the repeaters. It is also possible to provide a computer inside an optical amplifier so as to calculate pump laser intensity values and compensate values in tables with use of the computer. In this case, an injected laser intensity, etc. may be used to give consideration to the saturation, etc. in a Raman amplifier, as well as the type and loss of the optical fiber transmission line 102-1 to be used as an amplification medium. The pump laser intensity can thus be calculated more accurately.

Figure 12:
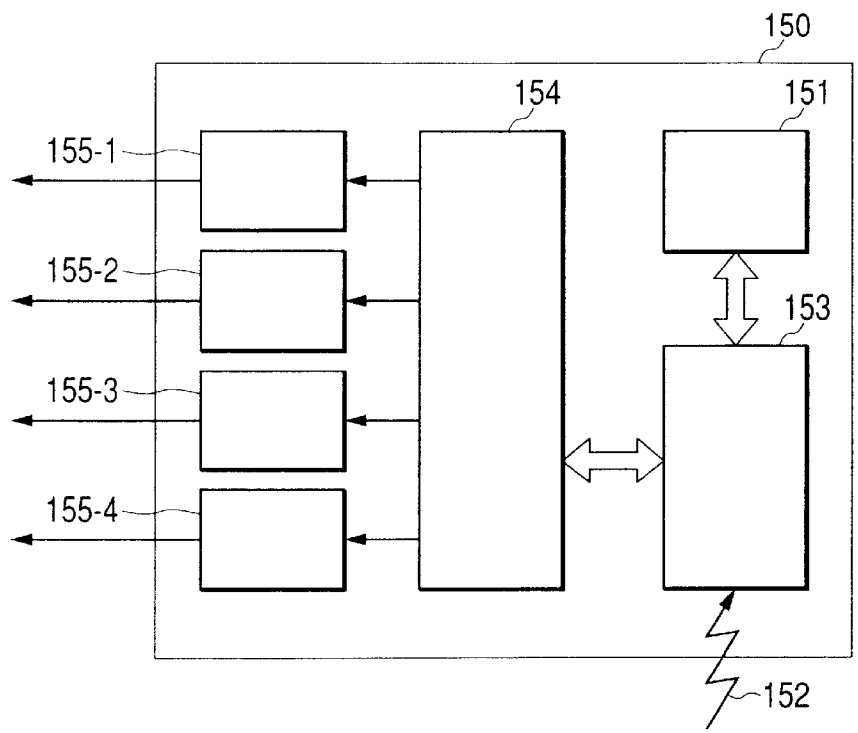
FIG. 12 is a block diagram of a pump laser source controller 150 of the present invention as shown in FIG. 11.

FIG. 12 shows a block diagram of the pump laser source controller 150 shown in FIG. 11. The micro controller 153, receiving an add-on start signal 152, reads the pump laser intensity table 151 stored in such a non-volatile memory as a flash memory under the control of an inner program. The micro controller 153 then calculates the intensity of each pump laser source for a fixed time so as to set the result for an A/D converter 154. The output voltage of the A/D converter 154 is converted to a current by one of the laser drive circuits 155-1 to 155-4 and is used to drive a semiconductor laser, which is a pump laser source. The current is then converted to a pump laser.

Figure 13:
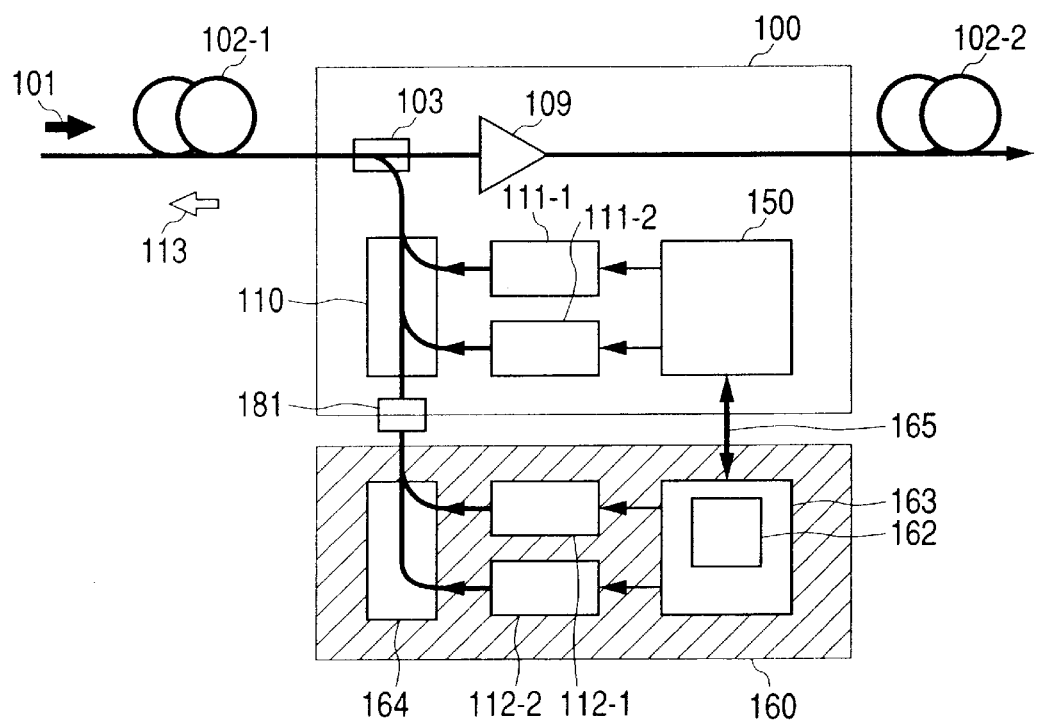
FIG. 13 is a schematic diagram of an optical amplifier representing a fourth embodiment of the present invention.

FIG. 13 is a schematic diagram of an optical amplifier representing a fourth embodiment of the present invention. In this embodiment, an add-on pump laser source controller 163 is built in an add-on pump laser source unit 160 so as to control each pump laser more precisely. A pump laser source information table 162 provided in the controller 163 stores information concerning each device, such as a relationship between laser drive current and output intensity of each of the pump laser sources 112-1 and 112-2 to be added on, the loss information of the wavelength multiplexer 164, etc. Those information items are combined so as to set a pump laser intensity value more precisely. The pump laser source information table 162 should preferably be stored in such a rewritable non-volatile medium as a flash memory so that it is used more effectively. The pump laser source information table 162 can also store output laser intensity set values of all or some of the added-on pump laser sources. In this case, it is possible to change the set values of the wavelength and output intensity of the pump laser sources 112-1 and 112-2 after the repeater 100 is installed, thereby the system configuration becomes more flexible.

The pump laser source controller 150 and the add-on pump laser source controller 163 are connected to each other via an internal information path 165, so that information in the information tables in them, as well as the presence of an add-on unit, each unit state, add-on timing, etc. can be exchanged between those controllers 150 and 163. For example, it is possible to store loss information of a pump laser source add-on port 161 in the pump laser source controller 150 beforehand so that the loss information is passed to the added-on unit 160. In the case of the automatic control method to be described later, it is possible to pass pump laser control signals to the add-on pump laser source unit 160 as they are, so that the unit 160 can be built in a control loop. The controllers 150 and 163 may be omitted, however. only the pump laser source information table and the A/D converter need be disposed at the added-on unit side.

Figure 14:
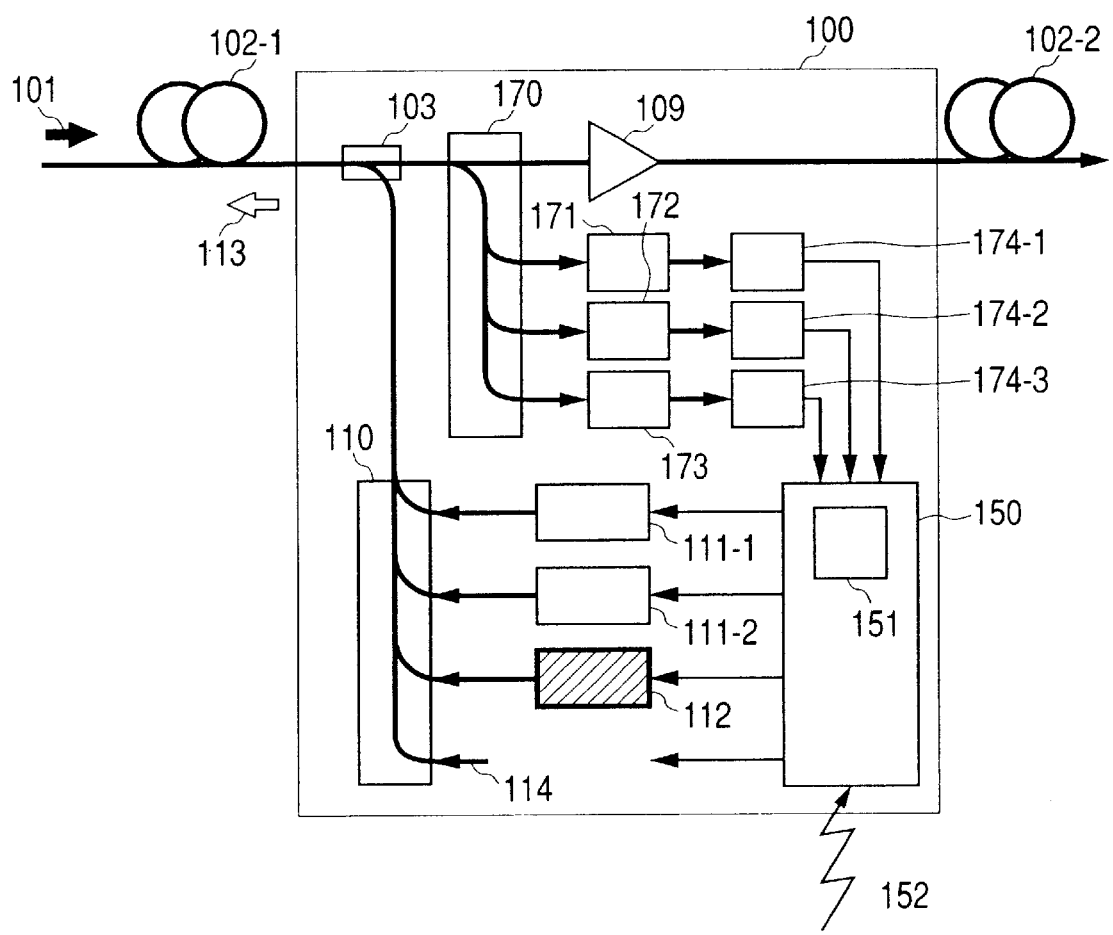
FIG. 14 is a schematic diagram of an optical amplifier representing a fifth embodiment of the present invention.

FIG. 14 is a schematic diagram of an optical amplifier representing a fifth embodiment of the present invention. In this fifth embodiment, the present invention applies to a system for controlling the Raman amplification gain slope/tilt automatically. In this fifth embodiment, a Blue-band pump laser source is added on for a pre-installed Red-band Raman amplifier. The optical repeater 100 observes the level of the ASE (Amplified Spontaneous Emission) emitted from each optical amplifier so as to find the Raman amplification gain, then effects control so as to flatten the gain with use of the result. The gain shape to be controlled here need not necessarily be flat; for example, it may be the result of suppressing a tilt of a wavelength-multiplexed signal with use of a Raman gain, giving the signal a specific gain slope/tilt internally. The present invention can apply to any of those cases, since a gain change of an pre-installed optical signal caused by add-on of a new pump laser source often degrades the signal transmission.

Figure 15:
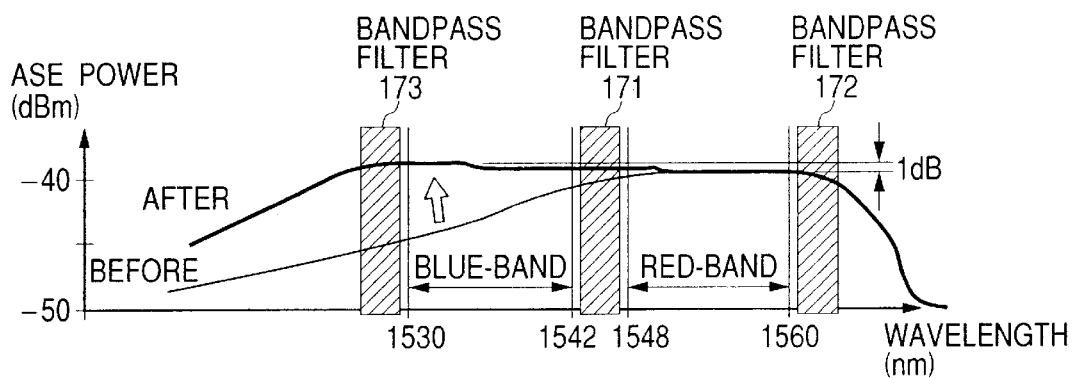
FIG. 15 is a graph which shows the gain characteristic of the optical amplifier in the fifth embodiment of the present invention.

The optical branch 170 takes out part of the wavelength-multiplexed signal and leads it into three optical band-pass filters 171 to 173, respectively. The transmission bands of those three band-pass filters are, as shown in FIG.15, an intermediate portion between the Blue-band and the Red-band, the long wavelength side of the Red-band, and the short wavelength side of the Blue-band, each of them being set outside the optical signal band. Consequently, only the ASE lights in those bands are led into the photo detectors 174-1 to 174-3, thereby the intensity measurement results are sent to the pump laser source controller 150. Before the Blue-band is added on, the outputs from the optical band-pass filters 171 and 172 provided at both sides of the Red-band are controlled so as to be fixed to a certain ratio, respectively, thereby controlling the Raman gain to be flat.

When the Blue-band is added on, an add-on Raman pump laser source 112 is connected and the output of an optical band-pass filter 173 at the Blue-band short wavelength side is added for starting the control. In this embodiment, control is performed so that a predetermined ratio is kept between the output of the optical band-pass filter 173 that denotes the gain of a newly added-on band and the output of another band-pass filter while the output levels of the optical band-pass filters 171 and 172 that denote a Raman gain in the Red-band respectively are kept unchanged. A pump laser source can thus be added on while the gain of each optical signal in the pre-installed bands is kept fixedly. In FIG. 15, the thin line denotes a gain obtained before the add-on and the thick line denotes a gain obtained after the add-on. The ASE level is amplified almost in accordance with this gain, so that the control of the present invention is enabled.

It is possible to keep the gain of each optical signal in the pre-installed bands to a certain level even in a transition state by adjusting the output intensity value of the pre-installed pump laser sources continually by increasing the output intensity of the add-on Raman pump laser source 112 step by step so as to keep the output levels of the optical band-pass filters 171 and 172 unchanged.

An ASE level is determined by a gain of an optical amplifier and a noise figure. The ASE level is changed by a wavelength significantly. At the same time, the ASE intensity is the accumulation of the ASE noise from every optical repeater on the upstream side. Therefore, the Raman gain to which a signal light is subjected is not flattened even when the ASE level at both ends of a signal band is set equally. This problem can be solved, however, by flattening the Raman gain after weighting the output signal from each photo detector 174 with the NF characteristic of each optical amplifier in the pump laser source controller 150. More precisely, when the ASE level information observed in the nearest optical amplifier on the upstream side is transmitted to each optical repeater on the downstream side, the Raman gain can be observed at a minimum error.

Figure 16:
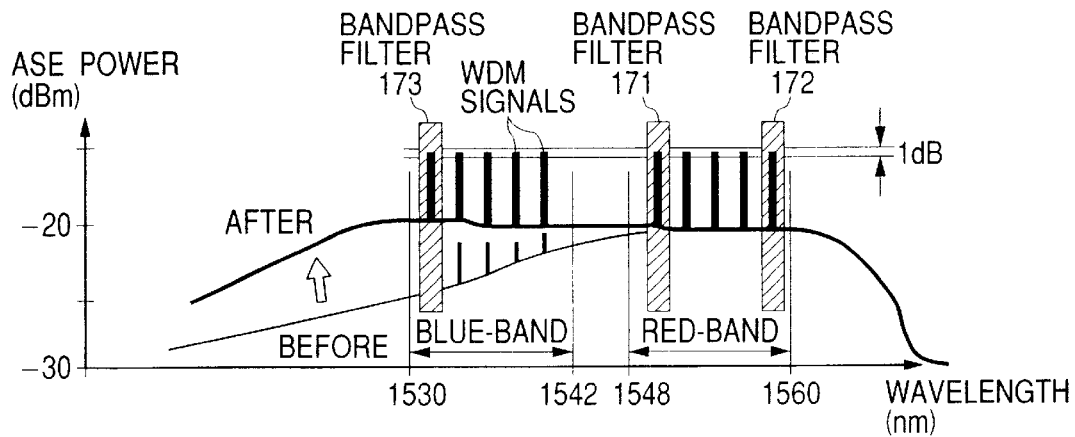
FIG. 16 is a graph which shows the gain characteristic of the optical amplifier in the fifth embodiment of the present invention.

FIG. 16 shows a graph of the gain characteristic for describing controlling of a Raman gain by observing the signal light level in the embodiment shown in FIG. 14. The optical band-pass filters 171 to 173, as denoted by the dark portion in FIG. 16, are set in the bands at the short wavelength side of the Red-band, the long wavelength side of the Red-band, and the short wavelength side of the Blue-band, respectively, so as to observe the optical signal intensity values. Each of those band-pass filters 171 to 173 is set so as to take out the signal light for one channel. The controlling method in this case is the same as that described with reference to FIG. 15. The intensity values of the pre-installed Raman pump laser sources 111-1 and 111-2 are controlled before the add-on so that the optical output intensity of each of the optical band-pass filters 171 and 172, which are signal levels at both ends of the Red-band, becomes a predetermined intensity value.

After the Raman pump laser source 112 is added on, the signal level is observed at the short wavelength side of the Blue-band and controlling is done so that a certain ratio is assumed between the signal level and the light intensity of the Red-band, or so that a predetermined intensity value is assumed. At this time, the pre-installed Raman pump laser sources 111-2 and 111-3 are controlled so that the optical signal intensity values of the optical band-pass filters 171 and 172 take the same values as those assumed before the add-on, thereby the pre-installed Red-band signal intensity values are prevented from changes.

The pre-installed Raman pump laser sources 111-2 and 111-3 are controlled even in the add-on process so that the output intensity of the add-on Raman pump laser source 112 increases gradually and the optical signal intensity values of the optical band-pass filters 171 and 172 take the same optical signal intensity values as those before the add-on continually, thereby preventing the transient transmission degradation in the add-on process.

As described above, when a new band is added on after the intensity and the ASE level of a signal light are observed, the gain changes are suppressed automatically in each pre-installed band at the add-on time and the gain shape of the new add-on band can be set to a predetermined one even when a significant Raman interaction occurs between the pump laser and another pump laser, the Raman gain is non-linear, and the gain shape in a transition state is difficult to estimate. In the case of the WDM transmission in a wide band, the tilting of each signal light generated by the Raman effect among signal lights can be suppressed.

While three photo detectors and three optical filters are used to observe each gain slope in the pre-installed and added-on bands, more photo detectors and optical filters may be used and the optical branch may be replaced with an wavelength demultiplexer such as an AWG (Arrayed Wave Guide). In addition, more photo detectors may be added on and a spectrum analyzer, etc. may be used to control complicated gains. While only the Raman gain is observed in the above example, the gain observation point may be shifted, for example, behind the lumped constant optical amplifier 109 so that signal gain shapes including the gain of the lumped amplifier 109 are controlled. The present invention covers all of those cases where a new pump laser source is added on while changes of gains and intensity values of pre-installed signals are suppressed. This is also the same when the number of pump laser sources increases.

The controlling algorithm is not limited only to the above-described one; controlling may be complicated more by combining the controlling methods in which the sum of pump laser powers is fixed, the level of each optical signal is fixed, etc., and by adding such information as the number of channels, received optical signal intensity values, etc. obtained, for example, from a monitor signal to the control.

Figure 17:
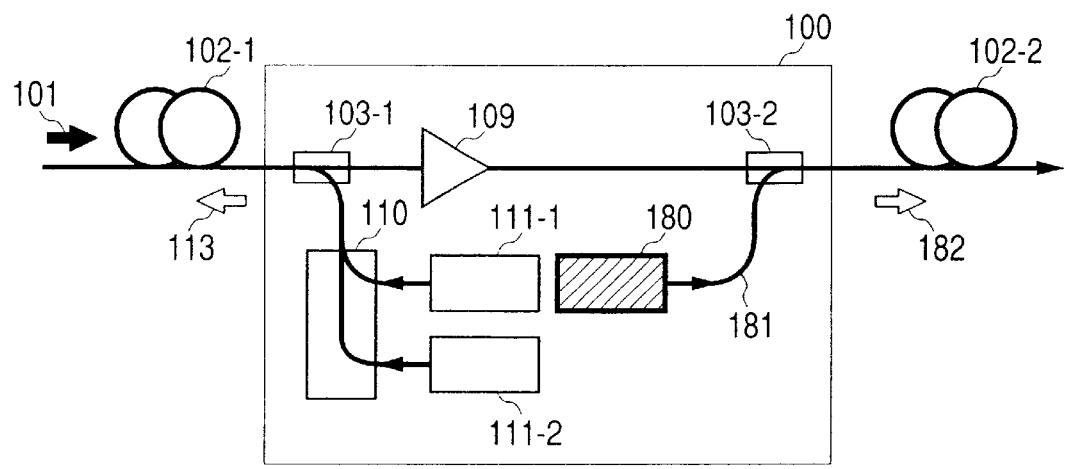
FIG. 17 is a schematic diagram of an optical amplifier representing a sixth embodiment of the present invention.

FIG. 17 is a schematic diagram of an optical amplifier representing a sixth embodiment of the present invention. In this sixth embodiment, a Raman pump multiplexer 103-2 is disposed at the output side of an optical repeater and a forward pump laser source add-on port 181 is provided for the optical amplifier. While the pre-installed Raman pump laser sources 111-1 and 111-2 are used for backward pumping and the add-on Raman pump laser source 180 is used for forward pumping in this embodiment, the functions and the add-on method are almost the same as those in the above embodiments. This sixth embodiment has an advantage that Raman interaction among the pre-installed and add-on pump lasers are reduced more than in the above embodiments. However, in order to keep the gain of each pre-installed band in an optical fiber transmission line unchanged, it is required for this embodiment to precisely control both forward and backward pump laser intensity values output from the optical repeaters at two points at both upstream and downstream sides of the optical fiber transmission line simultaneously and reach the state after the add-on from the state before the add-on via a transition state. However, because it is just required approximately to keep the level of each optical signal transmitted in a pre-installed band unchanged, it is possible to change the outputs from the pre-installed backward Raman pump laser sources 111-1 and 111-2, as well as the output from the add-on forward Raman pump laser source that are all disposed in the same repeater simultaneously, thereby keeping the total gain fixed. The outputs of those pump laser sources are applied to the upstream side.

Figure 18:
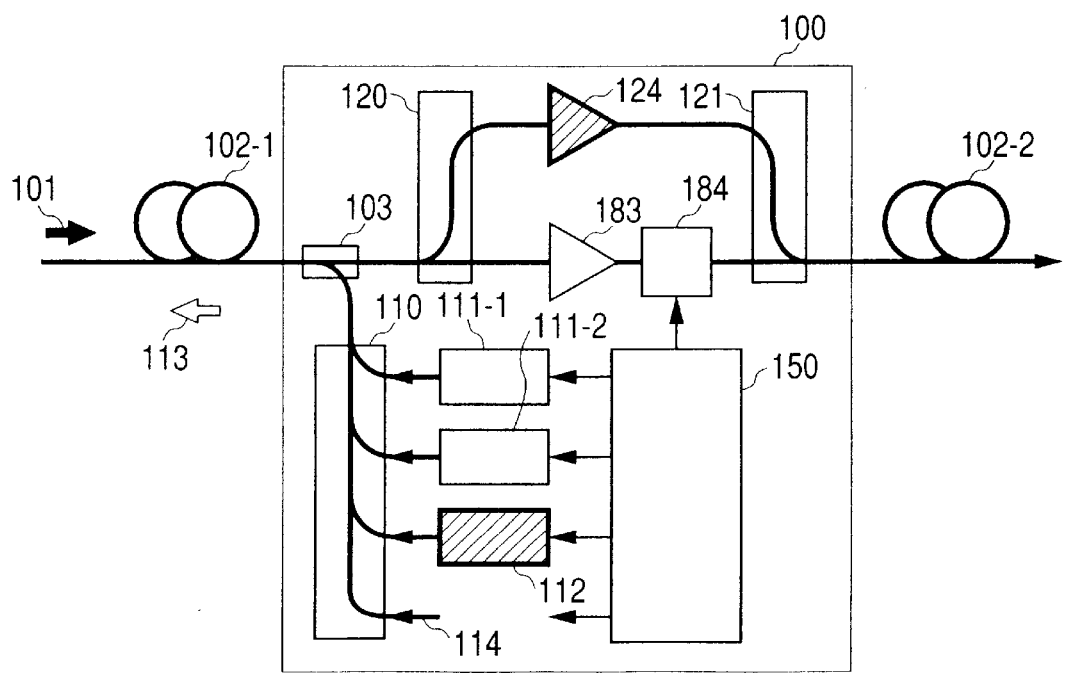
FIG. 18 is a schematic diagram of an optical amplifier representing a seventh embodiment of the present invention.

FIG. 18 is a schematic diagram of an optical amplifier representing a seventh embodiment of the present invention. In this seventh embodiment, a variable gain equalizer 184 is disposed just after a C-band EDFA 183, which is a pre-installed lumped optical amplifier. The pump laser source controller 150 in this embodiment controls the add-on Raman pump laser source 112 and the variable gain equalizer 184 together. The controller 150 cancels the change of the pre-installed C-band gain caused by the add-on pump laser source 112 that is turned on by changing the wavelength attenuation characteristic of the variable gain equalizer 184 so as to keep the C-band gain at a fixed value. This is why signals in the pre-installed bands can be prevented from degradation while the light intensity of each pre-installed pump laser source is not changed unnecessarily. The method of control in this embodiment may be combined together with the control method for the pre-installed pump laser source 111. In addition, as described with reference to the above-described embodiments, control methods to flatten either the intensity of each signal laser or gain spectrum can apply to this embodiment. Consequently, it is possible to prevent gains from changes before, after, and in an add-on process even when no complicated control is being carried out for gain shapes.

Figure 19:
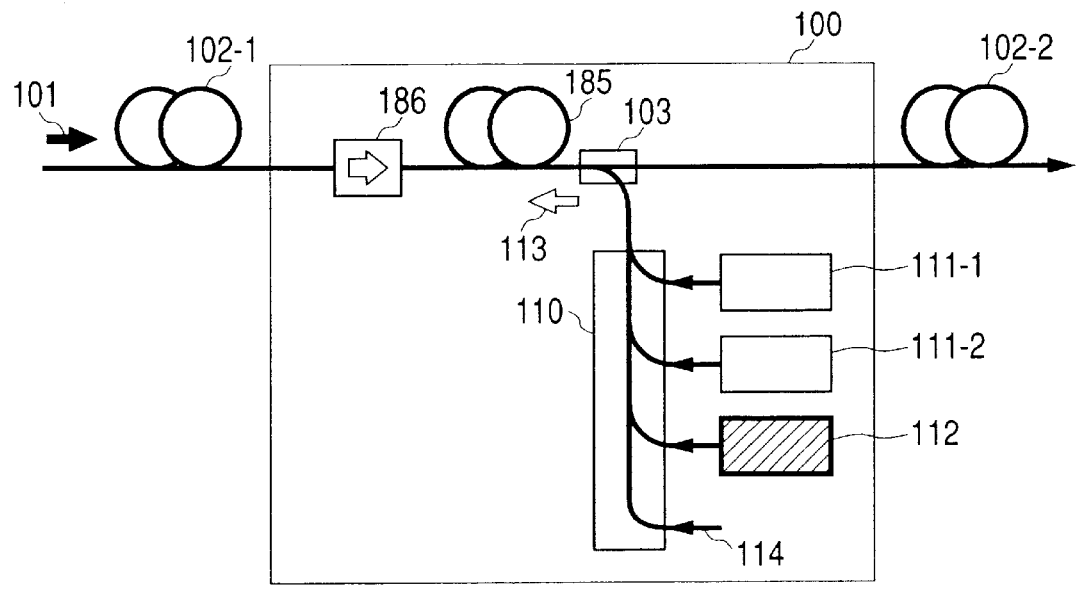
FIG. 19 is a schematic diagram of an optical amplifier representing a eighth embodiment of the present invention.

FIG. 19 is a schematic diagram of an optical amplifier representing an eighth embodiment of the present invention. In particular, in this embodiment, the present invention applies to a lumped Raman amplifier. The gain medium in this embodiment is a Raman amplification fiber 185 for which a high non-linearity fiber, dispersion compensation fiber (DCF), etc. are used. In this embodiment, the Raman pump laser light 113 is inputted to the Raman amplification fiber 185 and blocked by an optical isolator 186, so that the laser light 113 does not reach the optical fiber transmission line 102-1. Even in the lumped Raman amplifier, the gain in each pre-installed wavelength band is affected by an added-on Raman pump laser source 112, so that the present invention can apply to the lumped Raman amplifier as it is. While only the lumped Raman amplifier 185 is provided in the optical repeater 100 in FIG. 19, the amplifier 185 may also be used together with a lumped amplifier as an EDFA or a distributed Raman amplifier that uses a transmission line as a gain medium.

Figure 20:
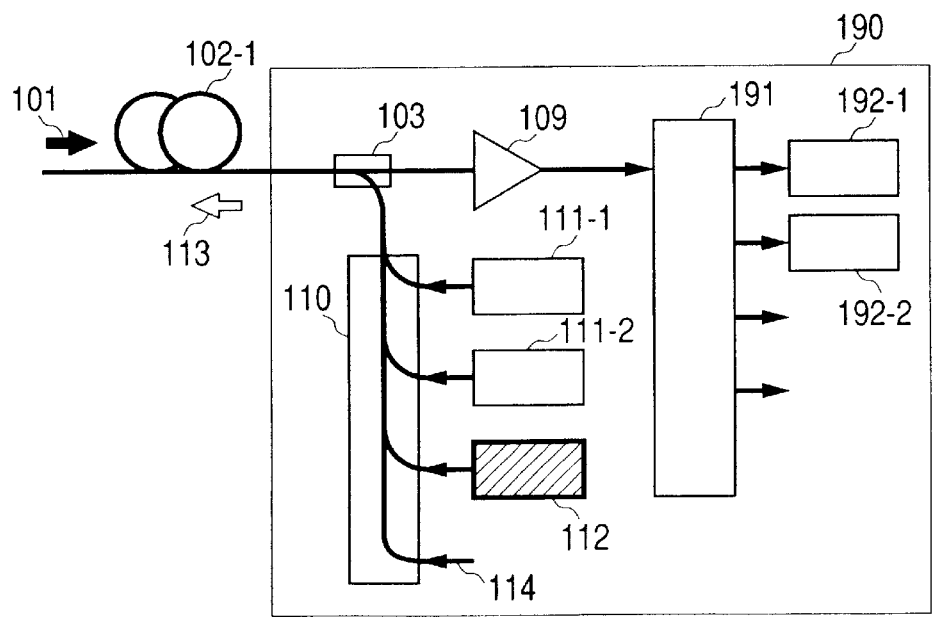
FIG. 20 is a schematic diagram of an optical amplifier representing a ninth embodiment of the present invention.

FIG. 20 is a schematic diagram of an optical amplifier representing a ninth embodiment of the present invention. In this embodiment, the optical amplifier is used as a pre-amplifier of an optical receiving site 190. A signal wavelength demultiplexer 191 is disposed at the output side of the lumped optical amplifier 109, and branched optical signals are received by the optical receivers 191-1, 191-2, etc. at their corresponding channels. Except for the configuration difference, the application method and the add-on method of the present invention in this embodiment are the same as those of the optical repeater. Those methods of the present invention are also the same when the present invention is applied to a transmitting site.

While the embodiments of the present invention have been described above, the present invention is not limited only to those embodiments. For example, while Raman amplifiers are used as distributed optical amplifiers in the above embodiments, the present invention can apply to any optical amplifiers that satisfy the following conditions: (1) a gain shape change occurs due to a pump laser wavelength, (2) optical amplification media common to both new and add-on bands are used, and (3) the gain bands of both or one of pre-installed and add-on pump laser are overlapping to the other gain band, and gains in both bands are not independent of each other. Such optical amplifiers are the above-described distributed Raman-amplifiers, as well as lumped constant Raman amplifiers, parametric optical amplifiers, optical amplifiers that employ the SBS (Stimulated Brillouin Scattering) method or a part of a rare-earth doped optical fiber, respectively, and many other examples. For example, when the amplification optical fiber of a lumped Raman amplifier is used commonly to amplify optical signals in all wavelength bands, the above conditions are satisfied, so that the pump laser add-on method of the present invention can apply to the amplifier as it is. When another optical amplifier shares amplification media with others, the method can also apply to the fiber in the same way. The present invention can also apply to the rare-earth doped optical fiber when it has a plurality of pumping states and its gain shape changes significantly in accordance with the wavelength of each pump laser.

The lumped optical amplifier in the above embodiments may be replaced with any of lumped optical amplifiers of other types. For example, the EDFA may be replaced with any of another type of rare-earth doped optical fiber amplifier, semiconductor optical amplifier, lumped constant Raman amplifier, etc. More specifically, the lumped optical amplifier part may be replaced with any optical amplifier that uses an independent gain medium for each of pre-installed and add-on bands or has no inter-band gain interaction, since an optical-amplifier can be added on independently for each band. Lumped constant Raman amplifiers are concentrated in an optical amplifier with the use of such a comparatively high non-linear fiber as the dispersion compensation fiber (DCF), the dispersion shifted fiber (DSF), as a gain medium.

Furthermore, the lumped constant Raman amplifier can change the wavelength/band setting freely in accordance with the application purpose. While bands before add-on are distinguished from bands after add-on in the description of the above embodiments, the distinction is not always required actually. Generally, the portion in which an information signal is transmitted before a pump laser is added on becomes "a pre-installed wavelength band" referred in the present invention, and a wavelength portion in which a signal laser is transmitted after the add-on becomes "an add-on wavelength band" referred in the present invention, respectively. Consequently, in the case of a method in which a transmission band is expanded while the wavelength of a pump laser is added on one by one, the present invention can apply to the method.

According to the embodiments of the present invention, therefore, it is possible to prevent each of the pre-installed optical signals from changes of the signal intensity, degradation, as well as to protect a receiver from damage even when a pump laser source is added on for a distributed Raman optical amplifier. It is also possible to flatten or shape the gain as desired even in an add-on band. It is also possible to prevent the gain in each pre-installed band from transient changes.

The foregoing invention has been described in terms of preferred embodiments. However, those skilled in the art will recognize that many variations of such embodiments exist. Such variations are intended to be within the scope of the present invention and the appended claims.

What is claimed is:

1. An amplification band-expanding method for optical amplifying means, comprising:
   a first step of adding on a second transmission band by changing a second pump laser source used to amplify a second optical signal of said second transmission band in an optical amplifying means from a non-pumping state to a pumping state while a first pump laser source used to amplify a first optical signal of a first transmission band in said optical amplifying means is pumped and amplifies said first optical signal in said optical amplifying means, said second transmission band and said first transmission band being different from each other; and
   a second step of controlling the output of said first pump laser source and said second pump laser source using a predetermined transition during a transition add-on period when said second pump laser source is changed from a non-pumping state to a pumping state in said first step, to maintain an approximation of the gain characteristic of said first transmission band in real-time throughout the transition add-on period of said second transmission band, to substantially the gain characteristic of said first transmission band before the transition add-on period of said second transmission band.

2. The amplification band-expanding method for optical amplifying means according to claim 1:
   wherein said second pump laser source is installed beforehand so as to supply a pump laser to said optical amplifying means when it will be required, or to be added on before an amplification band is expanded.

3. The amplification band-expanding method for optical amplifying means according to claim 1:
   wherein the output intensity of each of said first and second pump laser sources is controlled so that the gain characteristic of said first transmission band changes gradually in the transition add-on period between starting and ending of the output intensity controlling of said first and second pump laser sources.

4. The amplification band-expanding method for optical amplifying means according to claim 1:
   wherein the output intensity of each of said first and second pump laser sources is controlled so that the gain characteristic of said first transmission band changes gradually or the gain of said second transmission band increases gradually in the transition add-on period between starting and ending of the output intensity controlling of said first and second pump laser sources.

5. The amplification band-expanding method for optical amplifying means according to claim 1, where the predetermined transition is defined by a table storing output intensity levels of each of said first and second pump laser sources at a plurality of times during the transition add-on period.

6. The amplification band-expanding method for optical amplifying means according to claim 1, where the predetermined transition is effected by linearly varying output intensity levels of ones of pump laser sources of said first and second pump laser sources over time during the transition add-on period.

7. The amplification band-expanding method for optical amplifying means according to claim 1, where the predetermined transition is effected by continuously varying output intensity levels of ones of pump laser sources of said first and second pump laser sources over time during the transition add-on period.

8. An optical signal transmission apparatus, comprising:
   optical amplifying means provided with first and second transmission bands;
   multiplexing means for supplying a pump laser to said optical amplifying means;
   first and second pump laser sources; and
   controlling means for controlling the output of each of said first and second pump laser sources;
   wherein the output of each of said first and second pump laser sources is controlled using a predetermined transition during a transition add-on period when said second pump laser source is changed from a non-pumping state to a pumping state, to substantially maintain an approximation of a gain characteristic of said first transmission band in real-time throughout the transition add-on period of said second transmission band.

9. The optical signal transmission apparatus according to claim 8:
   wherein said apparatus is provided with a port by which said second pump laser source can be added on.

10. The optical signal transmission apparatus according to claim 8:
    wherein said controlling means is provided with a function that can control the output intensity of each of said first and second pump laser sources so that the gain characteristic of said first transmission band changes gradually in the transition add-on period.

11. The optical signal transmission apparatus according to claim 8:
    wherein said controlling means is provided with a function that can control the output intensity of each of said first and second pump laser sources so that the gain characteristic of said first transmission band changes gradually or the gain of said second transmission band increases gradually in the transition add-on period.

12. The optical signal transmission apparatus according to claim 8:
    wherein said controlling means is provided with a pump laser source controller for controlling one of the wavelength or the intensity of each of said first and second pump laser sources with time so that the total gain characteristics of the gain of said first pump laser source and the gain of said second pump laser source takes a value equal or close to the gain characteristic before the add-on of said second pump laser source at least in said first transmission band in the transition add-on period.

13. The optical transmission apparatus according to claim 8:
    wherein said optical amplifying means is a distributed Raman optical amplifier or a combination of said distributed Raman optical amplifier and a lumped optical amplifier.

14. The optical transmission apparatus according to claim 8:

wherein said optical amplifying means is a distributed Raman amplifier that uses an optical fiber transmission line as an amplifying medium.

15. The optical transmission apparatus according to claim 8:

wherein said controlling means is provided with a table for storing the output intensity of each of said first and second pump laser sources after the add-on of said second transmission band; and a controller for controlling the output intensity of each of said first and second pump laser sources according to a value in said table.

16. The optical transmission apparatus according to claim 8:

wherein said apparatus is provided with a filter for taking out an optical signal around each of said first and second transmission bands before and after the add-on of said second pump laser source; and means for inputting the output of said filter to said controlling means as control information of said first and second pump laser sources.

17. The optical transmission apparatus according to claim 8:

wherein said controller takes out specific information from an optical signal transmitted by said first or second transmission band so as to control said pump laser source according to said specific information.

18. The optical transmission apparatus according to claim 8, where the predetermined transition is defined by a table storing output intensity levels of each of said first and second pump laser sources at a plurality of times during the transition add-on period.

19. The optical transmission apparatus according to claim 8, where the predetermined transition is effected by linearly varying output intensity levels of ones of pump laser sources of said first and second pump laser sources over time during the transition add-on period.

20. The optical transmission apparatus according to claim 8, where the predetermined transition is effected by continuously varying output intensity levels of ones of pump laser sources of said first and second pump laser sources over time during the transition add-on period.

21. An optical signal transmission apparatus, comprising:

an optical amplifier provided with first and second transmission bands;

a multiplexer to multiplex a pump laser to said optical amplifying means;

first and second pump laser sources; and a controller to control the output of each of said first and second pump laser sources;

wherein the output of each of said first and second pump laser sources is controlled using a predetermined transition during a transition add-on period when said second pump laser source is changed from a non-pumping state to a pumping state, to substantially maintain an approximation of a gain characteristic of said first transmission band in real-time throughout the transition add-on period of said second transmission band.

* * * * *